(12) United States Patent
Underwood et al.

(10) Patent No.: US 10,790,139 B2
(45) Date of Patent: Sep. 29, 2020

(54) DEPOSITION OF SILICON AND OXYGEN-CONTAINING FILMS WITHOUT AN OXIDIZER

(71) Applicant: Applied Materials, Inc., Santa Clara, CA (US)

(72) Inventors: Brian Saxton Underwood, Santa Clara, CA (US); Abhijit Basu Mallick, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/112,737

(22) PCT Filed: Jan. 5, 2015

(86) PCT No.: PCT/US2015/010177
§ 371 (c)(1),
(2) Date: Jul. 20, 2016

(87) PCT Pub. No.: WO2015/112324
PCT Pub. Date: Jul. 30, 2015

(65) Prior Publication Data
US 2016/0336174 A1    Nov. 17, 2016

Related U.S. Application Data

(60) Provisional application No. 61/931,209, filed on Jan. 24, 2014.

(51) Int. Cl.
*H01L 21/02* (2006.01)
*C23C 16/452* (2006.01)
(Continued)

(52) U.S. Cl.
CPC .... *H01L 21/02216* (2013.01); *C23C 16/0272* (2013.01); *C23C 16/401* (2013.01);
(Continued)

(58) Field of Classification Search
CPC ......... H01L 21/02216; H01L 21/02164; H01L 21/02274; H01J 37/32183;
(Continued)

(56) References Cited

U.S. PATENT DOCUMENTS 4,585,671 A    4/1986  Kitagawa et al.
7,745,352 B2   6/2010  Mallick et al.
(Continued)

FOREIGN PATENT DOCUMENTS

| CN | 101473426 A | 7/2009 |
|---|---|---|
| CN | 103258785 A | 8/2013 |
| TW | 200529360 A | 9/2005 |

OTHER PUBLICATIONS

International Search Report and Written Opinion, PCT/US2015/010177, dated Apr. 27, 2015.

(Continued)

*Primary Examiner* — Thanh T Nguyen
(74) *Attorney, Agent, or Firm* — Patterson + Sheridan, LLP

(57) ABSTRACT

A silicon and oxygen-containing film, such as a silicon dioxide film, is deposited in the absence of an oxidizer by introducing siloxane precursors into a plasma processing chamber and dissociating at least some of the Si—H bonds of the siloxane precursors by, for example, exposing the siloxane precursors to a low energy plasma. The silicon and oxygen-containing film may be formed on an oxidation-prone surface without oxidizing the oxidation-prone surface. The deposited silicon and oxygen-containing film may serve as an initiation layer for a silicon dioxide bulk layer that is formed on top of the initiation layer using conventional silicon oxide deposition techniques, such as exposing the siloxane precursors to an oxygen-containing plasma. The initiation layer may be post-treated or cured to reduce the (Continued)

concentration of Si—H bonds prior to or after the deposition of the bulk layer.

20 Claims, 1 Drawing Sheet

(51) Int. Cl.
    *C23C 16/505*      (2006.01)
    *C23C 16/56*      (2006.01)
    *C23C 16/40*      (2006.01)
    *C23C 16/02*      (2006.01)
    *H01J 37/32*      (2006.01)

(52) U.S. Cl.
    CPC .......... *C23C 16/402* (2013.01); *C23C 16/452* (2013.01); *C23C 16/505* (2013.01); *C23C 16/56* (2013.01); *H01J 37/32183* (2013.01); *H01J 37/32357* (2013.01); *H01J 37/32513* (2013.01); *H01J 37/32623* (2013.01); *H01L 21/02164* (2013.01); *H01L 21/02274* (2013.01); *H01J 37/32449* (2013.01)

(58) Field of Classification Search
    CPC ........... H01J 37/32513; H01J 37/32357; H01J 37/32623; C23C 16/452; C23C 16/402; C23C 16/505
    See application file for complete search history.

(56) References Cited

U.S. PATENT DOCUMENTS

| | | | |
|---|---|---|---|
| 7,790,634 B2 | 9/2010 | Munro et al. | |
| 7,825,038 B2 | 11/2010 | Ingle et al. | |
| 7,902,080 B2 | 3/2011 | Chen et al. | |
| 8,232,176 B2 | 7/2012 | Lubomirsky et al. | |
| 2001/0055672 A1* | 12/2001 | Todd | C07F 7/0896 428/212 |
| 2004/0039219 A1 | 2/2004 | Chen et al. | |
| 2004/0137243 A1 | 7/2004 | Gleason et al. | |
| 2005/0191855 A1* | 9/2005 | Chen | H01L 21/76807 438/687 |
| 2006/0128167 A1* | 6/2006 | Nakata | H01L 21/02118 438/795 |
| 2007/0281448 A1 | 12/2007 | Chen et al. | |
| 2007/0281495 A1 | 12/2007 | Mallick et al. | |
| 2007/0281496 A1 | 12/2007 | Ingle et al. | |
| 2007/0298585 A1 | 12/2007 | Lubomirsky et al. | |
| 2008/0026597 A1 | 1/2008 | Munro et al. | |
| 2009/0075490 A1* | 3/2009 | Dussarrat | H01L 21/02164 438/787 |
| 2011/0262642 A1* | 10/2011 | Xiao | C07F 7/025 427/255.394 |
| 2012/0280200 A1* | 11/2012 | Tada | H01L 45/04 257/4 |
| 2013/0207245 A1* | 8/2013 | Inoue | H01L 23/53295 257/632 |
| 2013/0330935 A1 | 12/2013 | Varadarajan | |

OTHER PUBLICATIONS

Chinese Search Report dated Feb. 8, 2018 for Application No. 2015800040374.

Office Action for Chinese Application No. 201580004037.4 dated May 31, 2019.

\* cited by examiner

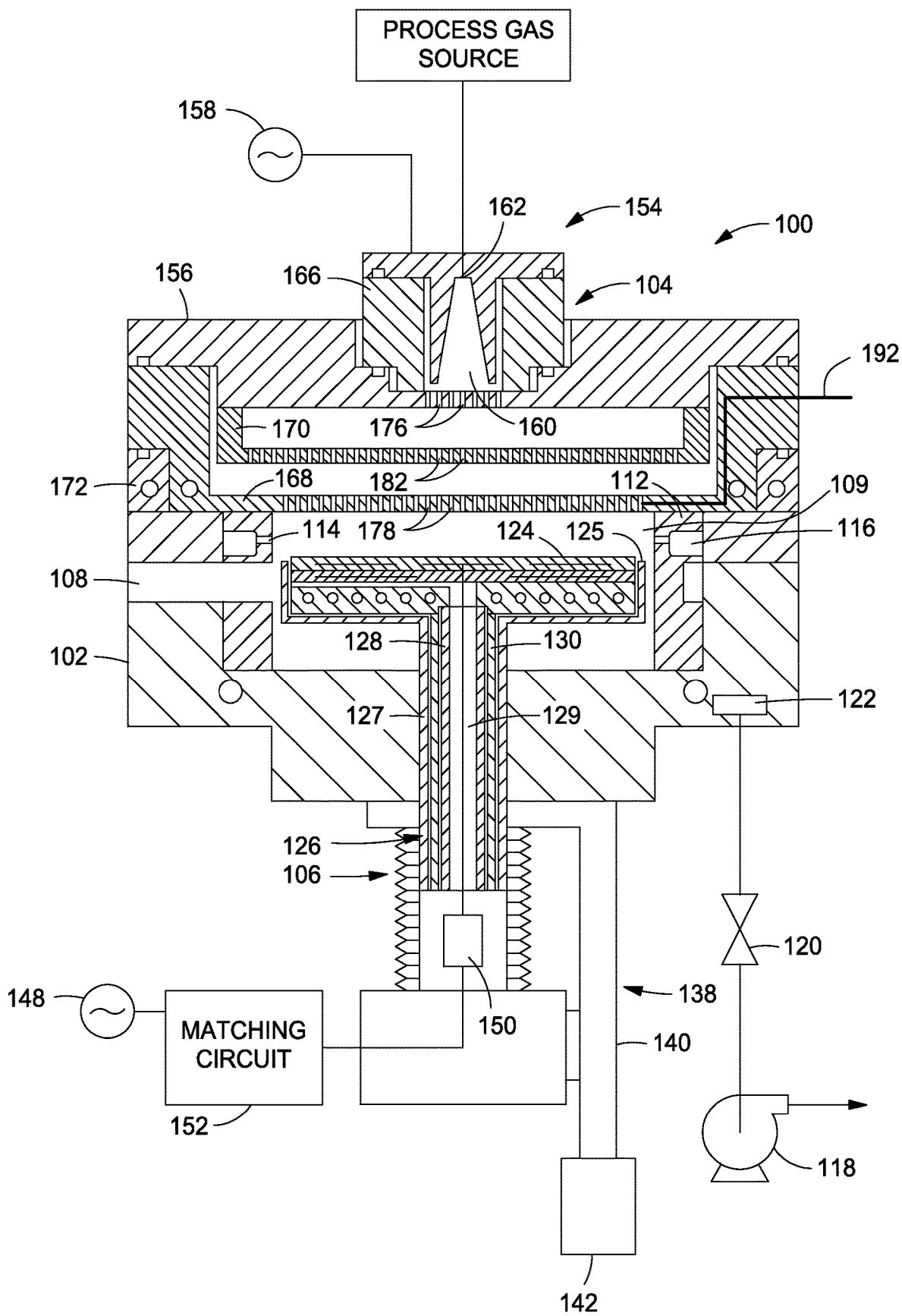

DEPOSITION OF SILICON AND OXYGEN-CONTAINING FILMS WITHOUT AN OXIDIZER

BACKGROUND

1. Field of the Invention

Embodiments of the present disclosure generally relate to the deposition of silicon and oxygen-containing films, and more specifically to deposition of silicon and oxygen-containing films, such as silicon dioxide, in the absence of an oxidizer.

2. Description of the Related Art

An obstacle for decreasing the size of integrated circuit geometries is the inability to deposit an oxygen-containing film, such as a film containing a Si—O—Si linkage, for example, silicon dioxide films using conventional deposition techniques, on a material prone to oxidation without oxidizing the oxidation-prone material. Films containing a Si—O—Si linkage are referred to herein as silicon and oxygen-containing films. Oxygen-containing plasma processes, high temperature oxidation steam anneals, and other techniques used to apply oxygen-containing films can easily oxidize an underlying material at an interface layer because these sources can penetrate through even a monolayer of deposition. In some situations, such as the fabrication of integrated circuits, oxidation of an underlying layer can be detrimental to the performance of the device.

Techniques have been used to form films in the absence of an oxidizer. For example, direct plasma deposition techniques have been used to deposit films in the presence of an inert gas, and capacitively coupled plasma and inductively coupled plasma chambers have been used to deposit films in the absence of an oxidative environment. However, the aforementioned techniques have been unable to form the Si—O—Si linkage desired for silicon and oxygen-containing films, such as silicon dioxide, silicon oxide, and other films containing silicon and oxygen.

Therefore, there is a need for a method to deposit oxygen-containing films, such as silicon and oxygen-containing films, for example, silicon dioxide, without oxidizing an underlying material.

SUMMARY

Embodiments disclosed herein form a silicon and oxygen-containing film on a surface, such as an oxidation-prone surface, in the absence of an oxidizer by introducing into a processing chamber siloxane precursors, such as acyclic siloxane precursors having the general formula $Si_xO_{x-1}H_{2x+2}$ and cyclic siloxane precursors having the general formula $Si_xO_xH_{2x}$, and selectively dissociating at least some of the Si—H bonds of the one or more siloxane precursors, such as by exposing the one more siloxane precursors to a low energy plasma. The deposited silicon and oxygen-containing film can serve as an initiation layer for a silicon dioxide bulk layer that is formed on top of the initiation layer using conventional silicon dioxide deposition techniques, such as exposing the siloxane precursors to an oxygen-containing plasma. The initiation layer can be post-treated to reduce the concentration of Si—H bonds, such as by ultraviolet treatment or ion implantation.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 is a cross-sectional view of one embodiment of a plasma processing chamber suitable for practicing embodiments of the present disclosure.

DETAILED DESCRIPTION

The descriptions of the various embodiments of the present disclosure have been presented for purposes of illustration, but are not intended to be exhaustive. Many modifications and variations will be apparent to those of ordinary skill in the art without departing from the scope and spirit of the described embodiments. The terminology used herein was chosen to best explain the principles of the embodiments, the practical applications or technical improvements over technologies found in the marketplace, or to enable others of ordinary skill in the art to understand the embodiments disclosed herein.

Embodiments disclosed herein generally provide methods for forming a silicon and oxygen-containing film in the absence of an oxidizer. More specifically, siloxane precursors are introduced into a plasma processing chamber and then exposed to a low energy plasma or a remote source of non-oxygen radicals to deposit an initiation layer. The low energy plasma or remote source of non-oxygen radicals selectively dissociates at least some of the Si—H bonds of the siloxane precursors, allowing for the deposition of a film in the absence of oxygen radicals or ions. A siloxane precursor is a molecule having a Si—O—Si linkage, thus having both Si—O and Si—H bonds. The siloxane precursors may be, for example, acyclic siloxane precursors having the general formula $Si_xO_{x-1}H_{2x+2}$ and/or cyclic siloxane precursors having the general formula $Si_xO_xH_{2x}$. By controlling temperature and activation energy, the Si—H bonds can be broken, while maintaining the Si—O bonds. Since the Si—O bonds are not broken, the oxygen does not become an active species (e.g., oxygen ions or radicals). Thus, the bound oxygen will not measurably oxidize the surface.

The plasma processing chamber can be any plasma processing chamber capable of producing a low energy plasma or exposing the siloxane precursors to a remote source of non-oxygen radicals. The deposited silicon and oxygen-containing film can serve as an initiation layer for a silicon dioxide bulk layer that can be formed on top of the initiation layer using conventional silicon dioxide deposition techniques, such as by exposing siloxane precursors to an oxygen-containing plasma. Bulk layers of other compositions may also be deposited on top of the initiation layer using different precursor gases or methods. Embodiments disclosed herein allow for the deposition of a silicon and oxygen-containing film on an oxidation-prone surface without oxidizing the oxidation-prone surface. The oxidation-prone surface may be composed of, for example, a metal, such as, for example, copper, silver, gold, aluminum, titanium, or tantalum. A surface is considered oxidation-prone if any portion of the surface is prone to oxidation. The initiation layer protects the oxidation-prone surface during the deposition of the bulk silicon dioxide layer. The initiation layer can be post-treated or cured to reduce the concentration of Si—H bonds before or after the deposition of the bulk layer.

FIG. 1 depicts a plasma processing chamber 100 that may be utilized to practice embodiments disclosed herein. One plasma processing chamber that may be adapted to perform disclosed embodiments is a Siconi™ chamber, which is available from Applied Materials, Santa Clara, Calif. It is contemplated that the methods described herein may be practiced in other suitably adapted plasma processing chambers, including those from other manufacturers. Suitable plasma processing chambers include any processing chamber configured to produce a low energy plasma or any processing chamber coupled to a remote radical source configured to generate non-oxygen radicals. For example, the processing chamber may be a capacitively coupled or an inductively coupled plasma enhanced chemical vapor deposition (PECVD) chamber. The PECVD chamber may be a direct plasma chamber or include a remote plasma chamber. As defined herein, a low energy plasma is a plasma generated at an RF source or bias power of 250 W or less, such as less than 100 W, such as between about 10 W and about 50 W. If a remote radical source is used, the remote radical source may be, for example, a capacitively coupled or inductively coupled remote plasma source, a remote microwave plasma-assisted CVD (MPCVD) chamber, a remote hot wire chemical vapor deposition (HW-CVD) chamber, or a remote electron cyclotron resonance (ECR) source. Remote plasma sources and remote radical sources generate plasma and radicals, respectively, in regions spatially separated from the regions where deposition occurs.

The plasma processing chamber 100 includes a chamber body 102, a lid assembly 104, and a substrate support assembly 106. The lid assembly 104 is disposed at an upper end of the chamber body 102, and the substrate support assembly 106 is at least partially disposed within the chamber body 102. The lid assembly 104 may serve as a remote plasma source.

The chamber body 102 includes a slit valve opening 108 formed in a sidewall thereof to provide access to the interior of the processing chamber 100. The slit valve opening 108 is selectively opened and closed to allow access to the interior of the chamber body 102 by a wafer handling robot (not shown). The chamber body 102 can further include a liner 112 that surrounds the substrate support assembly 106. Liner 112 may include one or more apertures 114 and a pumping channel 116 formed therein that is in fluid communication with a vacuum system. The apertures 114 provide a flow path for gases into the pumping channel 116, which provides an egress for the gases within the processing chamber 100. The chamber body also includes a process region 109 between the pedestal 124 and the distribution plate 168.

The vacuum system can include a vacuum pump 118 and a throttle valve 120 to regulate flow of gases through the processing chamber 100. The vacuum pump 118 is coupled to a vacuum port 122 disposed in the chamber body 102 and therefore, in fluid communication with the pumping channel 116 formed within the liner 112. The terms "gas" and "gases" are used interchangeably, unless otherwise noted, and refer to one or more precursors, reactants, catalysts, carrier, purge, cleaning, combinations thereof, as well as any other fluid introduced into the chamber body 102.

The substrate support assembly 106 includes a pedestal 124 that is coupled to a shaft assembly 126. The pedestal 124 has an upper surface adapted to support a substrate (not shown). The pedestal 124 may also include a RF electrode, configured as a cathode and made of a conductive material. The cathode may comprise an aluminum plate. The cathode may be directly coupled to the central shaft 128 of the shaft assembly 126, which provides RF energy to the cathode from the RF power source 148 through the connector 150. A shield member 125 may be disposed about the periphery of the pedestal 124. The shield member 125 may comprise a conductive material, such as aluminum.

The shaft assembly 126 may comprise at least three tubular members that move vertically within the chamber body 102. For example, the shield member 125 may be coupled to a shaft portion 127 that is disposed in an opening in the chamber body 102. A central shaft 128 is disposed within the shaft assembly 126 and includes a hollow portion or core 129. The central shaft 128 is made of a conductive material, such as aluminum, and is utilized as a RF current carrying member. The central shaft 128 and the shaft portion 127 of the shield member 125 are electrically separated by an insulative shaft 130 disposed therebetween. The material for the insulative shaft 130 may include ceramics and polymeric materials that are resistant to heat and process chemistry, as well as other process resistant materials.

The pedestal 124 may be connected to an RF power source 148 by a connector 150 and the central shaft 128. A matching circuit 152 may be coupled between the connector 150 and the RF power source 148 when the RF power source 148 does not include an integral matching circuit. The RF power source 148 is generally capable of producing an RF signal having a frequency from about 50 kHz to about 200 MHz and a power between about 0 Watts and about 5000 Watts. The RF power source 148 may be coupled to a conductive plate in the pedestal 124. The RF bias power from the RF power source 148 may be used to excite and sustain a plasma discharge formed from the gases disposed in the process region 109 of the chamber body 102.

Vertical movement of the substrate support assembly 106 is provided by an actuator assembly 138. The actuator assembly 138 may include a support member 140 coupled to the chamber body 102 and an actuator 142.

The lid assembly 104 can serve as a remote plasma source and includes a first electrode 154 disposed vertically above a second electrode 156, confining a plasma volume or cavity 160 therebetween. The first electrode 154 is connected to a power source 158, such as an RF power supply, and the second electrode 156 is connected to ground, forming a capacitance between the two electrodes 154, 156. The second electrode 156 may include a plurality of gas passages or apertures 176 formed beneath the plasma cavity 160 to allow gas from the plasma cavity 160 to flow therethrough. The lid assembly 104 may also include an isolator ring 166 that electrically isolates the first electrode 154 from the second electrode 156.

The lid assembly 104 may include a first one or more gas inlets 162 (only one is shown) that is at least partially formed within the first electrode 154. One or more gases from a process gas source may enter the lid assembly 104 via the first one or more gas inlets 162. The first one or more gas inlets 162 are in fluid communication with the plasma cavity 160 at a first end thereof and coupled to one or more upstream gas sources and/or other gas delivery components, such as gas mixers, at a second end thereof.

The lid assembly 104 can further include a distribution plate 168 and blocker plate 170 adjacent to the second electrode 156. The second electrode 156, distribution plate 168, and blocker plate 170 can be stacked and disposed on a lid support plate 172, which is connected to the chamber body 102.

The blocker plate 170 may be disposed between the second electrode 156 and the distribution plate 168. The blocker plate 170 may be in good thermal and electrical contact with the second electrode 156. The blocker plate 170 includes a plurality of apertures 182 to provide a plurality of gas passages from the second electrode 156 to the distribution plate 168. The apertures 182 can be sized and positioned about the blocker plate 170 to provide a controlled and even flow distribution of gases to the distribution plate 168.

The distribution plate 168 may be a dual channel shower head. The distribution plate 168 may include a plurality of apertures 178 or passageways to distribute the flow of gases therethrough. The distribution plate 168 may include a second one or more gas inlets 192 (only one is shown) that are at least partially formed within the gas distribution plate 168. The second one or more gas inlets 192 are in fluid communication with at least some of the plurality of apertures 178 of the gas distribution plate 168 at a first end thereof and coupled at the second end to one or more sources of precursor gases selected to form silicon and oxygen-containing films. The apertures 178 can be sized and positioned about the distribution plate 168 to provide a controlled and even flow distribution to the chamber body 102 where the substrate to be processed is located. Gases from the first one or more gas inlets 162 and radicals formed in the plasma cavity 160 can pass through a first portion of the apertures 178, and gases from the second one or more gas inlets 192 can pass through a second portion of the apertures 178.

The method of forming the initiation layer includes the following steps, which may be performed in any order: siloxane precursors are introduced into the process region 109; and the siloxane precursors are exposed to a low energy plasma or remotely-formed non-oxygen radicals. Optionally, one or more inert gases may be introduced into the process region 109.

Siloxane precursors are introduced into the process region 109 of processing chamber 100 to provide species to form the silicon and oxygen-containing initiation layer, such as a silicon dioxide initiation layer. The siloxane precursors may be supplied from the gas inlets 192 to the gas distribution plate 168, as described in reference to FIG. 1, or by other suitable means. A siloxane precursor is a molecule having an Si—O—Si linkage. The siloxane precursors may include, for example, acyclic compounds having the general chemical formula of $Si_xO_{x-1}H_{2x+2}$ and cyclic compounds having the general formula $Si_xO_xH_{2x}$ (cyclic). Representative precursors include disiloxane ($SiH_3OSiH_3$), trisiloxane ($SiH_3OSiH_2OSiH_3$), tetrasiloxane ($SiH_3OSiH_2OSiH_2OSiH_3$), and cyclotrisiloxane (—$SiH_2OSiH_2OSiH_2O$—) (shown below).

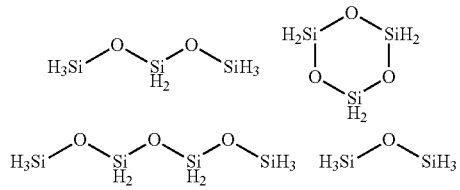

Optionally, secondary precursors may be introduced into the process region 109 of the processing chamber 100 to alter the resulting composition of the initiation layer. The secondary precursors may also be supplied from the gas inlets 192 to the gas distribution plate 168, as described in reference to FIG. 1, or by other suitable means. Secondary precursors are molecules, other than siloxane precursors, that have at least one Si—H bond. The use of secondary precursors may result in initiation layers composed of silicon and oxygen and one or more different elements, such as SiON or SiOC. Representative secondary precursors include trisilylamine, disilylmethane, trisilylmethane, and tetrasilylmethane (shown below).

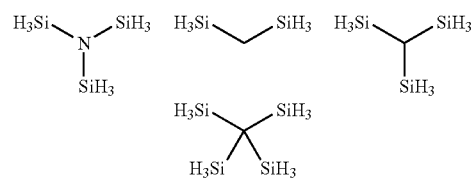

In an alternative embodiment, an initiation layer can be deposited using one or more of the secondary precursors without using a siloxane precursor, resulting in SiC, SiN, SiCN, or other initiation layers. For example, trisilylamine can be used to produce a SiN initiation layer; one or more of disilylmethane, trisilylmethane, and tetrasilylmethane can be used to form a SiC initiation layer; and a combination of trisilylamine and one or more of disilylmethane, trisilylmethane, and tetrasilylmethane can be used to produce a SiCN initiation layer. In yet another embodiment, a first portion of an initiation layer is formed using the secondary precursors without a siloxane precursor and then a second portion of the initiation layer is formed using a siloxane precursor and optionally a secondary precursor. Alternatively, a first portion of the initiation layer can be formed using a siloxane precursor without a secondary precursor and a second portion of the initiation layer can be formed using a secondary precursor with or without a siloxane precursor.

Optionally, one or more inert gases may be introduced into the process region 109 of the processing chamber 100. The one or more inert gases may be plasma-forming gases that can produce and sustain a plasma to form the initiation layer. The one or more inert gases may be supplied from the gas inlets 192 to the gas distribution plate 168, as described in reference to FIG. 1, or by other suitable means. Examples of suitable inert gases include argon, helium, nitrogen, and combinations thereof. For example, a helium and nitrogen mixture can be used.

To deposit the film using a low energy plasma, a low energy plasma is generated to selectively break at least some of the Si—H bonds of the precursors to form an initiation layer. The plasma is formed in the processing chamber 100 by applying sufficient RF bias power from the RF power source 148 to the RF electrode of the pedestal 124. The plasma may be generated from a bias RF power of less than about 250 W, such as less than about 100 W, such as between about 10 W and about 50 W. Alternatively, the plasma may be generated from an RF bias power of less than about 10 W.

To deposit the film using remotely-formed non-oxygen radicals, one or more non-inert gases and optionally one or more inert gases may be introduced into a remote radical source. For example, the one or more non-inert gases and optional one or more non-inert gases may be introduced into the plasma cavity 160 from the gas inlets 162. The radicals and other neutral species generated in the plasma cavity 160 may be introduced into the process region 109 of the processing chamber 100, but the charged species are prevented from reaching the processing area, such as by the blocker plate 170. Suitable non-inert gases include, for example, hydrogen. Suitable inert gases include, for example, argon, helium, and xenon. Once the mixture of inert and non-inert gases, such as a mixture including hydrogen and argon, are introduced into the plasma cavity 160, the RF power source 158 applies power to the first electrode 154 to produce and sustain a low energy plasma containing hydrogen radicals. The plasma may be generated from an RF source power of less than about 250 W, such as less than about 100 W, such as between about 10 W and about 50 W. Alternatively, the plasma may be generated from an RF source power of less than about 10 W. The hydrogen radicals travel through the second electrode 156, the blocker plate 170, and the distribution plate 168, and into the process region 109, where the hydrogen radicals selectively dissociate at least some of the Si—H bonds of the precursors, resulting in the deposition of an initiation layer. In alternative embodiments, the remotely-formed radicals may be generated by a HW-CVD chamber; a microwave plasma-assisted CVD (MPCVD); a different remote plasma source, such as an inductively coupled remote plasma source; or by any other source or device that can dissociate hydrogen and be isolated from the process region 109.

The initiation layer may be deposited at temperatures ranging from about 10° C. to about 600° C., such as between 10° C. and 300° C., such as between 10° C. and 50° C. The pressure during the initiation layer deposition may be from about 0.25 Torr to about 10 Torr. Deposition may continue until the initiation layer reaches a thickness of about 35 Å or thicker, such as, for example about 100 Å. Alternatively, deposition may continue until the initiation layer reaches a thickness less than about 35 Å. The deposited initiation layer contains at least some Si—H bonds, which, if desired, can be removed in a later post-treatment step.

In an alternative embodiment, the initiation layer is formed on a substrate having an oxidation-prone surface. The oxidation-prone surface may be composed of a metal, such as, for example, copper, silver, gold, aluminum, titanium, or tantalum. The initiation layer is formed in the absence of oxygen radicals and ions, which allows the initiation layer to be formed without oxidizing the oxidation-prone-surface.

In a representative example of a deposition of an initiation layer using a low energy plasma, the inert gases helium and argon are introduced into the process region 109 of the processing chamber 100 from the gas inlets 192 at flow rates of 2000 sccm and 500 sccm, respectively. The pressure and temperature of the processing chamber 100 are about 1000 mTorr and about 15° C. A plasma is generated and sustained by applying an RF bias power of 50 W to the RF electrode within the pedestal 124 from the RF power source 148. Then disiloxane is introduced into the chamber at a flow rate of 582 sccm. The deposition is carried out for 90 seconds and forms a silicon dioxide layer having a thickness of about 900 Å. In an alternative embodiment, a pre-tuning plasma match is performed, and disiloxane is introduced into the chamber before the plasma is generated.

Optionally, a bulk layer of silicon dioxide may be formed on top of the initiation layer. The bulk layer may have a thickness that is greater than the thickness of the initiation layer. The bulk layer may be formed using conventional processes, such as by exposing one or more siloxanes and/or one or more other silicon-containing precursors, such as silane, to an oxygen-containing plasma and/or using a higher RF bias power, such as an RF bias power of above 250 W. In forming the bulk layer, the siloxanes, other silicon-containing precursors, and oxygen can be introduced into the processing chamber 100 through the gas inlets 192, and a plasma may be generated by applying a sufficient RF bias power from the RF power source 148 to the RF electrode of the pedestal 124. The initiation layer protects the oxidation-prone surface from the oxygen-containing plasma during the deposition of the bulk silicon dioxide layer, allowing for a silicon dioxide bulk layer of a desired thickness to be formed on an oxidation-prone surface without oxidizing the oxidation-prone surface. Alternatively, bulk layers of other compositions can be formed on top of the initiation layer using well-known methods. For example, SiOC, SiON, and SiN bulk layers can be deposited on top of the initiation layer.

Also optionally, the initiation layer can be post-treated or cured to reduce the concentration of Si—H bonds in the initiation layer. The curing step can be performed after the initiation layer is deposited or after both the initiation layer and the bulk layer are deposited. A representative curing process is an ultraviolet curing process performed between about 1 Torr and about 100 Torr, at approximately 200° C., under a nitrogen and helium atmosphere, and using a broadband 1200 W UV bulb with UVA, UVB, and UVC signals and a lower wavelength of 170 nm. However, the wavelength may be less than 170 nm, such as less than 150 nm. Alternatively, ion implantation with nitrogen is performed below 20 mTorr with a 400 W source power and up to 5000 W bias power. In another embodiment, the initiation layer is treated with an electron beam at about 1,000 V to about 15,000 V, a bias power of −100 V is supplied to the middle showerhead, the current is varied from 1-20 mA, and the pressure is in the range of about 1 mTorr to about 100 mTorr. In another embodiment, the post-treatment process is a direct plasma, such as a high density plasma, with a thermal drying process.

In further embodiments, the initiation layer can be post-treated or cured using electron beam (e-beam) curing. E-beam curing or e-beam treatment involves exposing the as-deposited initiation layer to an e-beam. The substrate temperatures during e-beam treatment may be as described previously with respect to treatments in general. The electron beam energy may range from about 0.5 keV to about 30 keV, about 1 keV to about 15 keV or about 5 keV to about 10 keV in disclosed embodiments. The exposure dose may range from about $1 \mu C/cm^2$ to about $400 \mu C/cm^2$, from about $5 \mu C/cm^2$ to about $300 \mu C/cm^2$ or from about $50 \mu C/cm^2$ to about $200 \mu C/cm^2$ in embodiments described herein. Lastly, the electron beam current may range from about 1 mA to about 80 mA or about 5 mA to about 20 mA, in embodiments, and may be scanned across a substrate during the treatment process.

Silicon and oxygen-containing films, such as silicon dioxide films, formed using the methods disclosed herein allow for the formation of bulk silicon dioxide layers and layers of other compositions on oxidation-prone surfaces, such as metals, without oxidizing the oxidation-prone surfaces. By providing a method of depositing a silicon and oxygen-containing film without oxidizing an underlying oxidation-prone material, the embodiments disclosed herein allow for the continued decrease in the size of integrated circuit geometries.

While the foregoing is directed to embodiments of the present invention, other and further embodiments of the invention may be devised without departing from the basic scope thereof, and the scope thereof is determined by the claims that follow.

The invention claimed is:

1. A method for depositing a silicon and oxygen containing film, the method comprising:
introducing a process gas comprising one or more siloxane precursors into a processing chamber having a substrate disposed therein, wherein the one or more siloxane precursors are selected from the group consisting of acyclic siloxanes having the formula $Si_xO_{x-1}H_{2x+2}$, wherein x is 2 or more, and cyclic siloxanes having the formula $Si_xO_xH_{2x}$, wherein x is 3 or more, the one or more siloxane precursors having one or more Si—H bonds and one or more Si—O bonds;
selectively dissociating at least some of the Si—H bonds of the one or more siloxane precursors to deposit an initiation layer composed of silicon and oxygen over a first surface of the substrate, wherein Si—O bonds are substantially maintained and the initiation layer is deposited in the absence of an oxidizer;
exposing the initiation layer to a curing process selected from a UV curing process and an e-beam curing process to eliminate a portion of the Si—H bonds in the initiation layer; and
forming a bulk layer composed of silicon and oxygen on the initiation layer, comprising:
introducing into the processing chamber an oxygen-containing plasma or a plasma formed from an RF source or bias power of greater than 250 W.

2. The method of claim 1, wherein the selectively dissociating at least some of the Si—H bonds further comprises exposing the one or more siloxane precursors to a plasma generated at an RF source or bias power of 250 W or less.

3. The method of claim 2, wherein the process gas comprises one or more secondary precursors having at least one Si—H bond.

4. The method of claim 3, wherein the one or more secondary precursors include at least one precursor selected from the group consisting of trisilylamine, disilylmethane, trisilylmethane, and tetrasilylmethane.

5. The method of claim 2, wherein the one or more siloxane precursors include at least one siloxane precursor selected from the group consisting of disiloxane ($SiH_3OSiH_3$), trisiloxane ($SiH_3OSiH_2OSiH_3$), tetrasiloxane ($SiH_3OSiH_2OSiH_2OSiH_3$), and cyclotrisiloxane (—$SiH_2OSiH_2OSiH_2O$—).

6. The method of claim 5, wherein the initiation layer has a thickness of at least 35 Å.

7. The method of claim 2, wherein the first surface of the substrate is an oxidation-prone surface.

8. The method of claim 1, wherein the selectively dissociating at least some of the Si—H bonds further comprises exposing the one or more siloxane precursors to remotely-formed hydrogen radicals.

9. The method of claim 1, wherein the one or more siloxane precursors include at least one siloxane precursor selected from the group consisting of disiloxane ($SiH_3OSiH_3$), trisiloxane ($SiH_3OSiH_2OSiH_3$), tetrasiloxane ($SiH_3OSiH_2OSiH_2OSiH_3$), and cyclotrisiloxane (—$SiH_2OSiH_2OSiH_2O$—).

10. The method of claim 1, wherein the curing process is the UV curing process and the UV curing process is performed at a wavelength of 170 nanometers or less.

11. The method of claim 1, wherein the curing process is the e-beam curing process and the e-beam curing process is performed at an electron beam energy in a range from about 0.5 keV to about 30 keV.

12. A method for depositing a silicon and oxygen containing film, the method comprising:
positioning a substrate having an oxidizable surface in a process chamber;
forming an initiation layer composed of silicon and oxygen using a process gas on the oxidizable surface, the process gas comprising:
one or more siloxane precursors selected from the group consisting of acyclic siloxanes having the formula $Si_xO_{x-1}H_{2x+2}$ and cyclic siloxanes having the formula $Si_xO_xH_{2x}$, the siloxane precursors having one or more Si—H bonds and one or more Si—O bonds; and
one or more secondary precursors having at least one Si—H bond, the process gas being activated using a plasma generated at an RF source or bias power of 250 W or less, wherein the initiation layer is deposited in the absence of an oxidizer;
exposing the initiation layer to a curing process selected from a UV curing process and an e-beam curing process to eliminate a portion of the Si—H bonds in the initiation layer; and
forming a bulk layer composed of silicon and oxygen on the initiation layer, comprising:
introducing into the processing chamber an oxygen-containing plasma or a plasma formed from an RF source or bias power of greater than 250 W.

13. The method of claim 12, wherein forming the initiation layer further comprises exposing the one or more siloxane precursors or the process gas to a low energy plasma.

14. The method of claim 12, wherein the one or more siloxane precursors include at least one siloxane precursor selected from the group consisting of disiloxane ($SiH_3OSiH_3$), trisiloxane ($SiH_3OSiH_2OSiH_3$), tetrasiloxane ($SiH_3OSiH_2OSiH_2OSiH_3$), and cyclotrisiloxane (—$SiH_2OSiH_2OSiH_2O$—).

15. The method of claim 12, wherein the one or more secondary precursors include at least one precursor selected from the group consisting of trisilylamine, disilylmethane, trisilylmethane, and tetrasilylmethane.

16. The method of claim 12, wherein the initiation layer has a thickness of at least 35 Å.

17. The method of claim 12, further comprising exposing the one or more siloxane precursors to remotely formed hydrogen radicals.

18. The method of claim 12, wherein the one or more siloxane precursors includes disiloxane.

19. The method of claim 12, wherein the plasma dissociates at least some of the Si—H bonds while the Si—O bonds are maintained.

20. A method for depositing a silicon and oxygen containing film, the method comprising:
introducing into a processing chamber a substrate having an oxidizable surface;
forming an initiation layer composed of silicon and oxygen on the oxidizable surface, comprising:
introducing one or more siloxane precursors into the processing chamber, wherein the one or more siloxane precursors are selected from the group consisting of disiloxane ($SiH_3OSiH_3$), trisiloxane ($SiH_3OSiH_2OSiH_3$), tetrasiloxane ($SiH_3OSiH_2OSiH_2OSiH_3$), and cyclotrisiloxane (—$SiH_2OSiH_2OSiH_2O$—), the one or more siloxane precursors having one or more Si—O bonds;
introducing into the processing chamber one or more secondary precursors having at least one Si—H bond, wherein the one or more secondary precursors are selected from the group consisting of trisilylamine, disilylmethane, trisilylmethane, and tetrasilylmethane; and selectively dissociating at least some of the Si—H bonds of the one or more siloxane precursors, wherein the Si—H bonds are dissociated by exposure to a plasma or by exposure to remotely-formed hydrogen radicals, and wherein the Si—O bonds are substantially maintained;

exposing the initiation layer to a curing process selected from a UV curing process and an e-beam curing process to eliminate a portion of the Si—H bonds in the initiation layer; and forming a bulk layer composed of silicon and oxygen on the initiation layer, comprising:

introducing into the processing chamber an oxygen-containing plasma or a plasma formed from an RF source or bias power of greater than 250 W, wherein the initiation layer is deposited in the absence of an oxidizer.

* * * * *